United States Patent [19]

Clark

[11] Patent Number: 5,627,533

[45] Date of Patent: May 6, 1997

[54] ADJUSTING ENCODING TABLE SIZE AND MEMORY ALLOCATION FOR DATA COMPRESSION IN RESPONSE TO INPUT DATA

[75] Inventor: Alan D. Clark, Roswell, Ga.

[73] Assignee: Hayes Microcomputer Products, Inc., Norcross, Ga.

[21] Appl. No.: 286,705

[22] Filed: Aug. 5, 1994

[51] Int. Cl.⁶ .................................................... H03M 7/30
[52] U.S. Cl. .................................................. 341/51; 341/87
[58] Field of Search ................................. 341/51, 63, 87

[56] References Cited

U.S. PATENT DOCUMENTS

| | | | |
|---|---|---|---|
| 4,366,551 | 12/1982 | Holtz | 364/900 |
| 4,464,650 | 8/1984 | Eastman et al. | 341/51 |
| 4,558,302 | 12/1985 | Welch | 341/51 |
| 4,612,532 | 9/1986 | Bacon et al. | 340/347 DD |
| 4,626,829 | 12/1986 | Hauck | 341/63 |
| 4,814,746 | 3/1989 | Miller et al. | 341/95 |
| 4,841,299 | 6/1989 | Weaver | 341/65 |
| 4,847,619 | 7/1989 | Kato et al. | 341/106 |
| 4,870,415 | 9/1989 | Van Maren et al. | 341/94 |
| 4,881,075 | 11/1989 | Weng | 341/87 |
| 4,929,946 | 5/1990 | O'Brien et al. | 341/87 |
| 5,434,568 | 7/1995 | Moll | 341/87 |
| 5,455,576 | 10/1995 | Clark, II et al. | 341/50 |
| 5,467,087 | 11/1995 | Chu | 341/51 |

OTHER PUBLICATIONS

Yokoo, Hidetoshi, Improved Variations Relating the Ziv–Lempel and Welch–type Algorithms for Sequencial Data Compressions, IEEE Transactions on Information Theory, Jan. 1992.

Proposed Adoption of CCITT Recommendation V.42 bis, CCITT Circular #19, Oct. 30, 1989.

Technical description of BTLZ Version 2.2—distributed Dec. 13, 1988 meeting—study group TR 03.1.

*Primary Examiner*—Marc S. Hoff
*Attorney, Agent, or Firm*—Jones & Askew

[57] ABSTRACT

A real-time method for improving data compression. The correlation between data characters being provided a modem (10) is determined. Two measures are used to determine the correlation between data characters: the shape of tree(s) (6) in encoding table (16) and the compression ratio (96). Once the correlation between data characters is determined using the two measures, the size of the encoding table (16) can be changed. If the data characters are not correlated, meaning the data is random or pseudo-random, the size of the encoding table is decreased. If the data characters are highly correlated, changing the size of the encoding table reduces time spent attempting to compress incompressible data and increases data compression for compressible data.

20 Claims, 7 Drawing Sheets

| 64 | -10 | VERY HIGH |
|---|---|---|
| 32 | -5 | HIGH |
| 16 | 0 | MEDIUM |
| 8 | 5 | LOW |
| 4 | 10 | VERY LOW |
FIG. 8a
| 1.0 | -10 | VERY LOW |
|---|---|---|
| 1.5 | -5 | LOW |
| 2.0 | 0 | MEDIUM |
| 2.5 | 5 | HIGH |
| 3.0 | 10 | VERY HIGH |
FIG. 8b
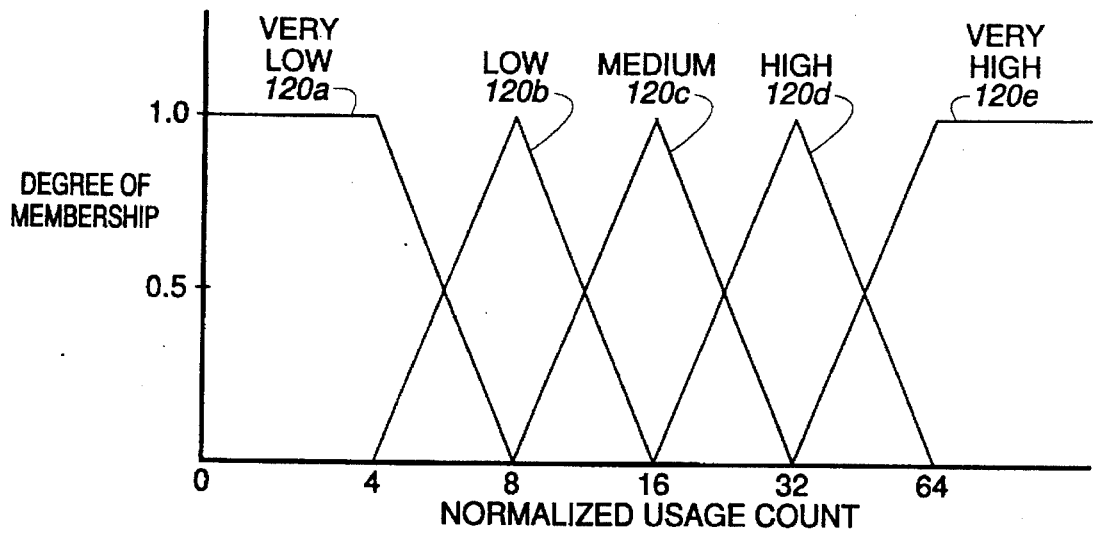
FIG. 8c
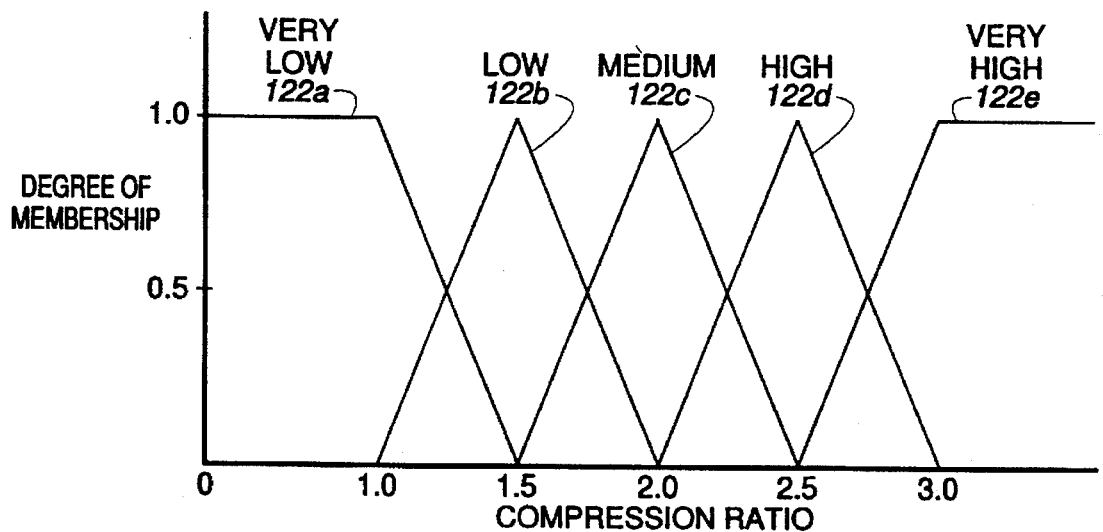
FIG. 8d

ADJUSTING ENCODING TABLE SIZE AND MEMORY ALLOCATION FOR DATA COMPRESSION IN RESPONSE TO INPUT DATA

TECHNICAL FIELD

The present invention relates generally to data compression, and more specifically relates to a real-time adaptive data compression method and apparatus which monitors and adjusts the size of the encoding table for data compression in real-time to optimize the relationship between processing time devoted to data compression and data compression achieved.

BACKGROUND OF THE INVENTION

String based data compression algorithms operate by identifying a string of recurring characters in a data stream and substituting a short codeword for the string. Many schemes and devices for data compression are known in the art. The most common data compression algorithms attempt to maximize the number of characters in the data stream for which short codewords are substituted. Broadly speaking, strings of characters are stored in an "encoding table" or library. Each string in an encoding table is associated with a codeword. The stream of data characters are compared to the strings in the encoding table. If a portion of the data characters in the stream of data characters match a string of characters in the encoding table, a codeword is substituted in the stream of data for the data characters. The greater the number of characters from the data stream that are matched to a string of characters in the encoding table, the higher is data compression. Thus, the more closely the strings of characters in the encoding table match the incoming data, the greater is the data compression.

Perhaps the easiest manner of making the encoding table most closely match the data stream is by pre-scanning the data to be transmitted into the encoding table. Theoretically, this would form the optimum data compression algorithm. Theoretically, one could pre-scan data to be transmitted and formulate the optimum scanning algorithm.

However, in real time applications such as data communications involving a modulator-demodulator ("modem"), it is not always possible or desirable to pre-scan data and establish the most efficient data encoding scheme. In such applications, the nature of the data may change, rendering a fixed compression scheme inefficient or even detrimental. Thus, a compression scheme that adapts in real-time to the nature of the data is desirable.

Most prior art adaptive real-time data compression methods rely on dynamically created tables in both an encoding device and a decoding device. In U.S. Pat. No. 4,612,532, issued to Bacon et al., a series of characters in a data stream are encoded in accordance with dynamically created tables in the encoding device, and the decoding device is constructed in a manner to create corresponding tables for decoding the encoded data, relying on the structure of the encoded data to create the decoding tables dynamically. Primarily, the encoding device relies on the assumption that a given character in the data stream has a given probability of being followed by one of a set of probable candidates for the next successive character. Accordingly, the encoding device creates a table in which, for a given character, there is presented a list of candidates, in approximate order of frequency of occurrence, for the next successive character that would occur in the data stream. When the given character occurs in the data stream, followed by a character in the table, the encoding device sends a binary code to represent the latter character based on the character's ordinal position in the table. This code is the shortest for the most frequently occurring candidates and longer for the candidates that are less frequently occurring. This table is created and updated based on the local frequency of occurrence of a character after a given character, thereby allowing the table to be changed dynamically as the nature of the local data changes.

Another encoding scheme was promulgated by the International Telegraph and Telephone Consultative Committee ("CCITT") as the V.42bis standard, which is incorporated by reference herein. The V.42bis standard operates similarly to the above, except that several characters are encoded using a single codeword. The V.42bis standard labels each character in the alphabet a "root character." The characters that might occur after or follow a root character are called strings or branches. For example, please refer to the prior art encoding scheme set forth in FIG. 1, and each of the root characters 4 "A", "B", "C" and "D". The characters depending from root character "B" are "A" and "I." Furthermore, there are characters depending from the characters "A" and "I". Thus, the words "BAG" and "BIN" are spelled out in strings beneath the root character "B." Each group of characters depending from a root character, such as "DE", "DO and "DOG", are referred to as strings 5.

Each of the strings in the encoding table is associated with a codeword. If the "BAG" sequence of data characters is detected in a data stream matched with the "BAG" string in the encoding table, a binary codeword representing the word "BAG" is transmitted in place of the word "BAG". Together, all the branches depending from a single root character are called a tree 6. A tree can be many shapes, such as short and wide or long and narrow.

In the V.42bis standard, the nature of the strings 5 in each tree are dynamically altered depending on the data in the data stream. Thus, characters in the encoding table for more recently used words are kept and grown based upon the data in the data stream, while less recently used leaf characters in trees may be pruned. For example, the string in FIG. 1 with the word "BAT" might be extended to encode the word "BATTLE". Therefore, a dictionary of the most recently used words is created and stored in the encoding and decoding tables in real-time.

Another data compression scheme familiar to those skilled in the art is the Microcom Networking Protocol-7 (MNP-7). This protocol associates pairs of characters with a codeword. Theoretically, one could associate pairs and, over time, build a library containing all possible combinations. If each of the 256 possible characters were combined into all possible pairs, it would take about one-half of a megabyte of memory to store the combinations. Therefore, the most common pairs are typically kept in memory of 1024 bytes in size. The pairs are rotated out of memory as new pairs are added to memory. Because of practical limitations on memory size, the MNP-7 is kept to a limited size and the entries in that table are selected based on the theory that recently used pairs will be repeated.

The "sliding window" approach to data compression is also familiar to those skilled in the art. A block of the most recently received data is stored (the window). As characters are received, the "oldest" character in the window is dropped out. Thus, the window is continually updated with new data. After each character is received, the current window is reviewed for a matching string. If a string is located in the window, a pointer to the string in the window is sent to the decoding table. The decoding table uses the pointer to access its own duplicate window and decode the characters.

Those skilled in the art will understand that the above data compression systems operates upon the assumption that data characters are non-random. The schemes assume that if a word occurred once, it will likely occur again. Further, the V.42bis relies on the inherent correlation, such as defined by rules of grammar, between characters in human language.

In all of the above data compression schemes, a larger encoding table allows a greater number of strings and/or longer strings to be stored, and the greater the number and length of strings stored in the encoding table, the more likely that a stream of data characters will be matched with a string in the encoding table. Therefore, it is frequently true that the larger the encoding table the greater the data compression.

The width and length of total tree branches in any scheme is limited by the total memory space allocated to the encoding table. In modems using the V.42bis standard, the memory space typically allocated to the encoding table is initially set to hold 2048 entries or strings, in memory of 32,768 bytes.

Other than the need to limit memory space consumed storing the encoding table, the size of the encoding table is also limited by two trade-offs. First, the modem must review each string under a root character to find a string matching the characters in the data stream. This process of reviewing each character in the character stream and trying to match the characters in the stream with a string in the encoding table takes significant processing time. Thus, limiting the size of the encoding table recognizes the inherent trade-off between having a large encoding table, thereby matching more strings to the data stream to achieve greater data compression, versus the slow-down in execution time, and thus data throughput time, caused by using a larger encoding table.

The second tradeoff is that increasing the size of the encoding table requires an increase in codeword size. For example, an eight bit codeword can represent, at most, 256 ($2^8$) strings. Thus, if an encoding table is increased in size to contain more than 256 strings, a larger codeword must be utilized. Thus, although more and longer strings in an encoding table may increase compression by matching more strings, the demand for an increased number of codewords leads to increased codeword size that reduces throughout and the compression ratio. On the other hand, a smaller encoding table allows for fewer strings, but codeword length is reduced.

As will be familiar to those skilled in the art, the above data compression/encoding schemes assume, and are most suitable for, applications wherein the data is highly correlated, that is, it is predetermined that the file being transmitted is text or numbers (but not both), and wherein the data is not random. However, in applications wherein the type of data is not predictable and changes over time, such as a real-time communications system, the above methods will employ a less than optimum code. The above compression schemes only adapt to changes in the correlation between data by reallocating codewords in real-time within a fixed-size encoding table.

Accordingly, there is a need to provide an adaptive data compression method which achieves greater dynamic adaptability relative to any type of data or distribution of types of data.

Furthermore, there is a need for a real-time data encoding scheme that balances the need to limit the processing time devoted to attempting to compress random or pseudo-random data, and yet achieves a high rate of data compression for non-random (correlated) data.

Furthermore, there is a need for an encoding scheme that eliminates passing long strings of identical characters into the encoding table. Specifically, when a string of identical characters are received in a modem, the modem will alter the encoding table to contain a very long string of the identical characters that will be compressed before transmission. This long string of characters is a distortion to the encoding and decoding tables, and frequently causes inefficiency to users of the V.42bis standard. Specifically, valuable space in the encoding table is used to store the string of identical characters, which string is usually useless during data transmission.

SUMMARY OF THE INVENTION

The present invention provides a scheme for real-time data compression wherein the random versus non-random nature of the data is determined, and this information is used to adjust the size of the encoding table to optimize data compression and the speed of data compression. Specifically, the size of the encoding table is increased for highly correlated data to achieve greater data compression. For weakly correlated data, the size of the encoding table is reduced to provide better performance. For random or pseudo-random data, the size of the encoding table is decreased to reduce the time spent trying to compress data and to use shorter codewords.

The present invention operates in a computer system for compressing a stream of data characters. The computer system includes an encoding table that includes a plurality of strings of characters, the strings of characters in the encoding table being correlated to codewords that may be substituted for portions of the stream of data characters when a portion of the stream of characters matches one of the strings of characters in the encoding table, thereby replacing portions of the stream of characters with corresponding codewords. The present invention is an apparatus and method for controlling the encoding table size to improve the efficiency and rate of data compression, the method including the steps of determining the correlation between incoming data characters, and adjusting the memory space allocated to the encoding table based upon the determined correlation between incoming data characters. The steps taken in adjusting the memory space allocated to the table are adjusting a performance index in response to the determined correlation between data characters, decreasing the memory space allocated to the encoding table when the performance index exceeds a predetermined first value, and increasing the memory space allocated to the encoding table when the performance index is less than a predetermined second value.

In the typical operation of the present invention, the method for controlling the encoding table to improve the efficiency and rate of data compression includes the steps of: determining a compression ratio for the stream of data characters input to the computer system, the compression ratio being equal to the number of characters input to the computer system divided by the number of data characters in the stream of data characters output from the computer system, determining a usage count, the usage count being proportional to the average width of the trees in the encoding table, calculating a performance index using the compression ratio and the usage count, and increasing or decreasing the memory space allocated to the encoding table based upon the value of the performance index. The performance index indicates the correlation between data characters in the stream of data characters input to the computer system.

Thus, the present invention will typically use two measures to detect the correlation between incoming data characters: (1) the actual data compression ratio being achieved, and (2) the width of one or more trees in the encoding table. The memory space allocated to the encoding table, sometimes called an encoding dictionary by those skilled in the art, is increased or decreased, depending on the data compression ratio currently being achieved and the estimated characteristics of the tree(s) in the encoding table. Thus, the size of the encoding table is adjusted according to the random or non-random nature of the incoming data, thereby optimizing compression while limiting time spent trying to compress data.

Addressing the typical method in the present invention of determining the compression ratio between data characters in more detail, those skilled in the art will recognize that modems sold today monitor and update the compression ratio being achieved by the modem. For example, in modems sold by Hayes Microcomputer Products, Inc., assignee to the present invention, the modem calculates the compression ratio after some fixed number of characters, such as after every five-thousand (5000) characters, received from a computer for transmission. If the compression ratio is low, the data is likely to be weakly correlated, random, or pseudo-random, because such data is relatively incompressible. The higher the compression ratio, the higher is the correlation between data characters.

The second measure typically used in the present invention to determine the correlation between characters in the data being processed is the shape of the trees in the encoding table. For example, when a modem is trying to compress random data, the width of a tree is typically relatively high because any character is equally likely to follow another character. Indeed, two-hundred and fifty-six characters might depend directly from each root character. Thus, for random data, the trees in an encoding table tend to be wide. Conversely, an encoding table receiving highly correlated data is assumed to have long and narrow trees. The present invention will detect that trees are long and narrow or short and wide.

The second measure used to determine the correlation between data characters is called a "usage count". Addressing the usage count in greater detail, the usage count is determined using a program module that may be inserted into the string matching program, the encoding table entry deletion loop program, or could be a separate program. The usage count is preferably inserted into the entry deletion program, because this consumes relatively low processing time as described below.

As is familiar to those skilled in the art, the entry deletion program is periodically called and sequentially searches through entries in memory to find a leaf character to be deleted. The entry deletion program steps through all entries looking for leaf characters to delete, and the usage count is the width of the tree based on the number of characters reviewed before finding a leaf character. The usage count is kept over a number of invocations of the entry deletion program, and a normalized usage count is calculated using the formula:

Normalized Usage Count=(total usage count)/(number of invocations of the entry deletion program)

The usage count is the number of characters examined before a leaf to be deleted is found, and the usage count is averaged over a large number of invocations of the entry deletion program to give a reasonable and stable basis for estimating tree width. Thus, the normalized usage count is used to estimate the shape of the trees in the encoding table. If desired the Average Width of trees in the encoding table can be calculated using the formula:

Average Width=1+2*(normalized usage count)

The width of the trees is thus estimated via the value of the normalized usage count, which is based on the total number of characters counted by the usage count in the entry deletion process. If the normalized usage count value is low, the trees are estimated to be narrow, indicating a high correlation in the data. A low normalized usage count is caused by many characters being between the root characters and leaf characters. In this case, the performance index is incremented by a chosen value. On the other hand, if the normalized usage count is high, the data is more random. In this case, the performance index will be decremented.

The method for determining the random versus non-random nature of incoming data and adjusting the size of the encoding table in response thereto can vary. Typically, in the present invention, the processor creates a "performance index" to correspond to the correlation between characters in the stream of data characters. The performance index is given an initial value (50), and that value is incremented or decremented based on the correlation between the data characters in the stream of data received, as defined by the compression ratio and normalized usage count. When, and if, the performance index reaches a predetermined maximum or minimum value (100 or 0, respectively) the size of the encoding table will be decreased or increased. After increasing or decreasing the size of the encoding table, the performance index is set back to a middle value (50) and the process repeats.

In the typical embodiment of the present invention, the two measures (compression ratio and characteristics of the encoding table) jointly determine whether the performance index is incremented or decremented. If the data compression ratio is less than 1, the data being input to the modem from the computer is actually being expanded before it is modulated and output on the data communication line. In this case in the present invention, the performance index is decremented by a large value. If the compression ratio is slightly greater than one, the performance index is decremented by a lesser value. As the compression ratio gets much greater than 1, the performance index is incremented by greater values. If the trees in the encoding table are estimated to be narrow the performance index is incremented, while if the trees are estimated to be wide the performance index is decremented. The width of the trees is estimated via the calculated normalized usage count.

The correlation between characters in the incoming stream of data is thus characterized by a calculated number—the performance index. The performance index is adjusted based on the compression ratio and usage counter. If the performance index attains a value of zero (0) or less, the size of the encoding table will be decreased because the data is weakly correlated, random, or pseudo-random. Decreasing the size of the encoding table decreases the processing time spent looking for matches between strings of characters in the encoding table and characters in the stream of data. Furthermore, decreasing the size of the encoding table decreases the size of the codeword.

Similarly, if the performance index attains a value of one-hundred (100) or more, the input data stream contains highly correlated characters, and the processor therefore increases the memory space allocated to the encoding table. This will allow for more and/or longer strings of characters to be stored in the encoding table, thereby allowing for increased data compression.

If the calculated performance index is between the first and second threshold values (0 and 100), the current memory space allocated to the encoding table is assumed to produce the optimum level of data compression requiring an acceptable amount of processor time. Thus, the size of the encoding table is not altered.

The two measures described above are combined to effect the performance index. For example, if the compression ratio is low and the normalized usage count is low (random data), the performance index would be decreased by a large amount, and if the performance index is less than zero, less memory space is allocated to the encoding table. On the other hand, if the compression ratio is high and the normalized usage count is high (highly correlated data) the performance index is increased, and the memory space allocated to the encoding table is increased.

The amount by which the performance index is incremented or decremented is called a "delta" value herein, and the delta value may be stepped up or down within each of the above discussed measures in accord with how far the measure deviates from a mean value. Thus, the system has adjustable sensitivity to the degree of correlation (or non-correlation) of the data.

In the encoding table, when data is first being received in the modem, the memory space allocated to the encoding table allows for up to 2048 entries. Thus, the encoding table is referred to as being a 2048 entry table. The total memory space typically allocated to the encoding table allows for 512, 1024, 2048, 4096, 8192 or 16384 entries. The encoding table is stepped up or down through these sizes as directed by the value of the performance index. As the size of the encoding table is changed, the size of the codeword is changed. Thus, if the encoding table holds 512, 1024, 2048, 4096, 8192 or 16384 entries, the codeword will be 9, 10, 11, 12, 13 or 14 bits respectively.

The result of the above-described operations is that when the data is weakly or not correlated the size of the encoding table is decreased, but when the data is highly correlated the size of the encoding table is increased. Decreasing the size of the encoding table decreases the amount of microprocessor time devoted to data compression and codeword size, which is appropriate when data is random and therefore incompressible, and can improve performance when the data is weakly correlated. On the other hand, increasing the size of the encoding table increases the amount of microprocessor time devoted to data compression.

The present invention could be used with many string encoding or compression schemes. These compression schemes operate by retaining a buffer of characters (history) and replacing a string in the data with a codeword that was matched to the previous occurrence of the same data string. Similar trade-offs in terms of buffer size versus codeword size and processing time apply in all these string based compression schemes, and the present invention may be used to achieve a similar optimization of performance by dynamically changing the buffer size in response to a computed performance index. Thus, the present invention is useful with the V.42bis, the MNP-7 encoding algorithm and many other data compression or encoding schemes.

The present invention also includes a preprocessing feature that helps to prevent distortion to the encoding table. In the usual environment of the present invention, a run length encoder is located in the modem before the data compression circuit (encoding table). The run length encoder recognizes strings of identical characters in the data that is being sent from the computer to the modem, and substitutes a code therefore. The code is then encoded with the encoding table and transmitted from the modem. The code is decoded following receipt at the decoding table.

The preprocessing feature of the present invention is used in a system wherein data is communicated from a terminal through a modem onto a communication line, wherein the modem compresses the data using an encoding table. The present invention is a method of pre-encoding strings of identical characters in the data before the modem encodes the data using the above-referenced encoding method including the encoding table, and includes the steps of detecting a series of sequential identical characters to be transmitted from the modem, and substituting a code in place of the series of sequential identical characters in the data passed to the encoding table described above for compression. The code is a predetermined signal, including the detected identical character repeated three times, and a number equal to the total number of times the identical character was repeated. The modem compresses data before it is passed to the encoding table and compressed according to the V.42bis protocol.

Thus, it is an object of the present invention to provide a data compression scheme that optimizes the size of the encoding and decoding tables to provide maximum data compression while consuming minimum processor time.

It is a further object of the present invention to provide a data compression scheme for use in data communication that adjusts the size of the encoding table in response to the detected correlation between data characters in a stream of data, whereby the size of the encoding table is decreased for more random data and the size of the encoding table is increased for more highly correlated data.

It is an object of the present invention to provide a data compression scheme for use with modems in a data communication network whereby contiguous occurrences of identical data characters are encoded in a run length encoder before the data is passed to the encoding table, thereby preventing corruption of the encoding table in the modem.

That the present invention accomplishes these objects and overcomes the above cited drawbacks of the prior art will be apparent to those skilled in the art from the detailed description of the preferred embodiment to follow.

BRIEF DESCRIPTION OF DRAWINGS

FIGS. 8a–d are diagrams showing the use of fuzzy logic techniques for carrying out the preferred method of data compression in the present invention.

DETAILED DESCRIPTION OF DRAWINGS

Figure 1:
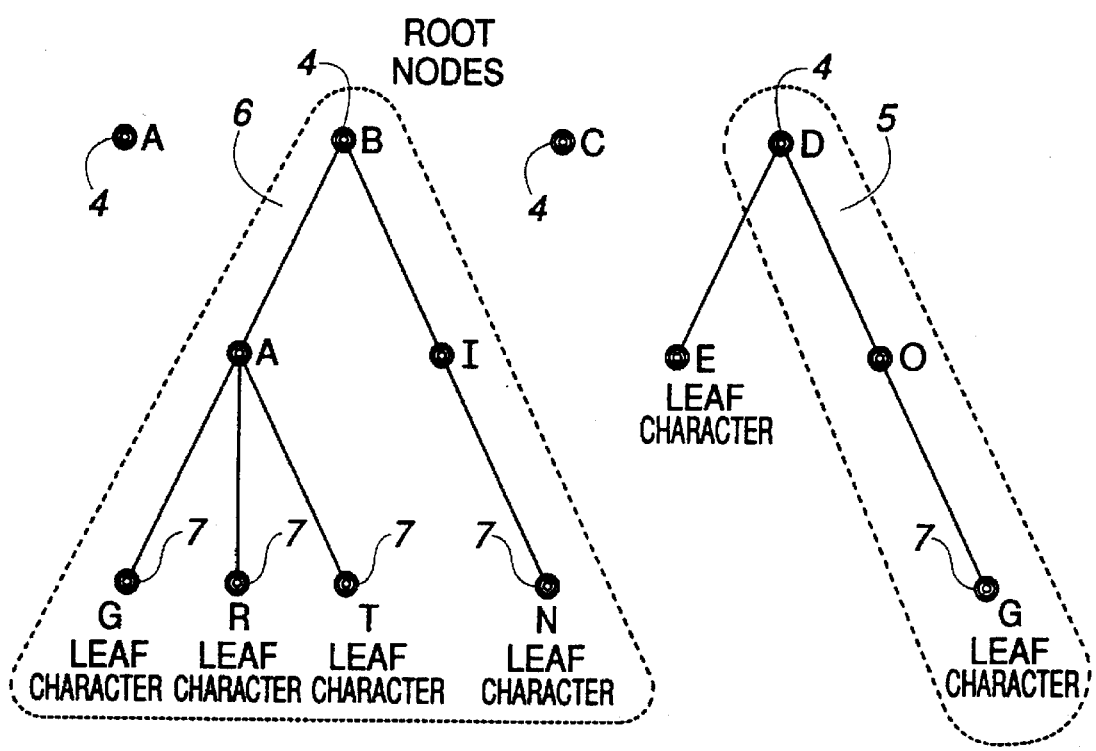
FIG. 1 is a diagram of trees in a string-based data encoding table.
Figure 2:
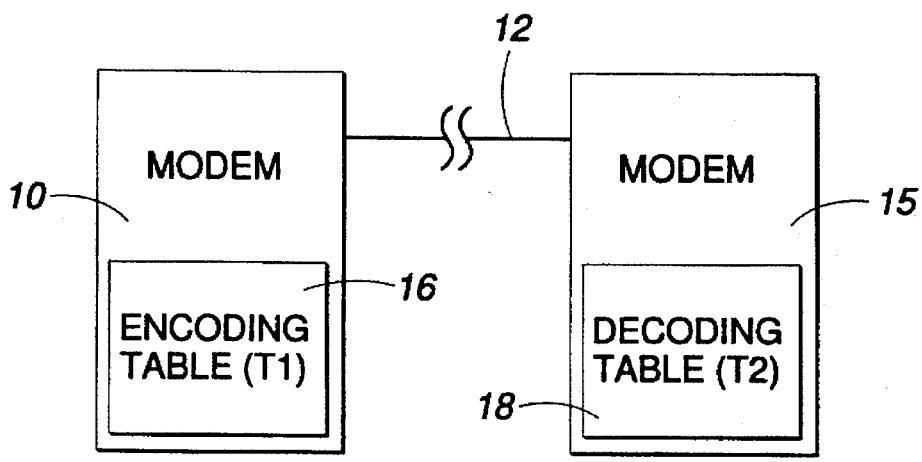
FIG. 2 is a schematic that illustrates a data communications application employing the preferred data compression method and apparatus of the present invention.

Turning next to FIGS. 1–9 in which like numerals indicate like parts, the preferred embodiment of the present invention will now be described. FIG. 2 is a schematic that illustrates a data communications application employing the preferred data compression method and apparatus of the present invention. The data compression scheme of the present invention is implemented to communicate data between modems 10 and 15 over telephone line 12 in the preferred embodiment of the present invention. Although the disclosed preferred embodiment is for use in a modem, it should be understood that the present invention is suitable for use in any type of data compression application, such as mass data storage, database compression, telemetry, video/picture compression, speech compression, seismic data compression and the like.

It should be understood that the preferred embodiment of the present invention relies on the use of an encoding device for compressing data and a separate but parallel decoding device for decoding compressed data. In accordance therewith, the modem 10 constructed in accordance with the preferred embodiment has associated therewith an encoding table 16 and the second modem 15 has a decoding table 18, constructed and maintained in the manner described below.

Figure 3:
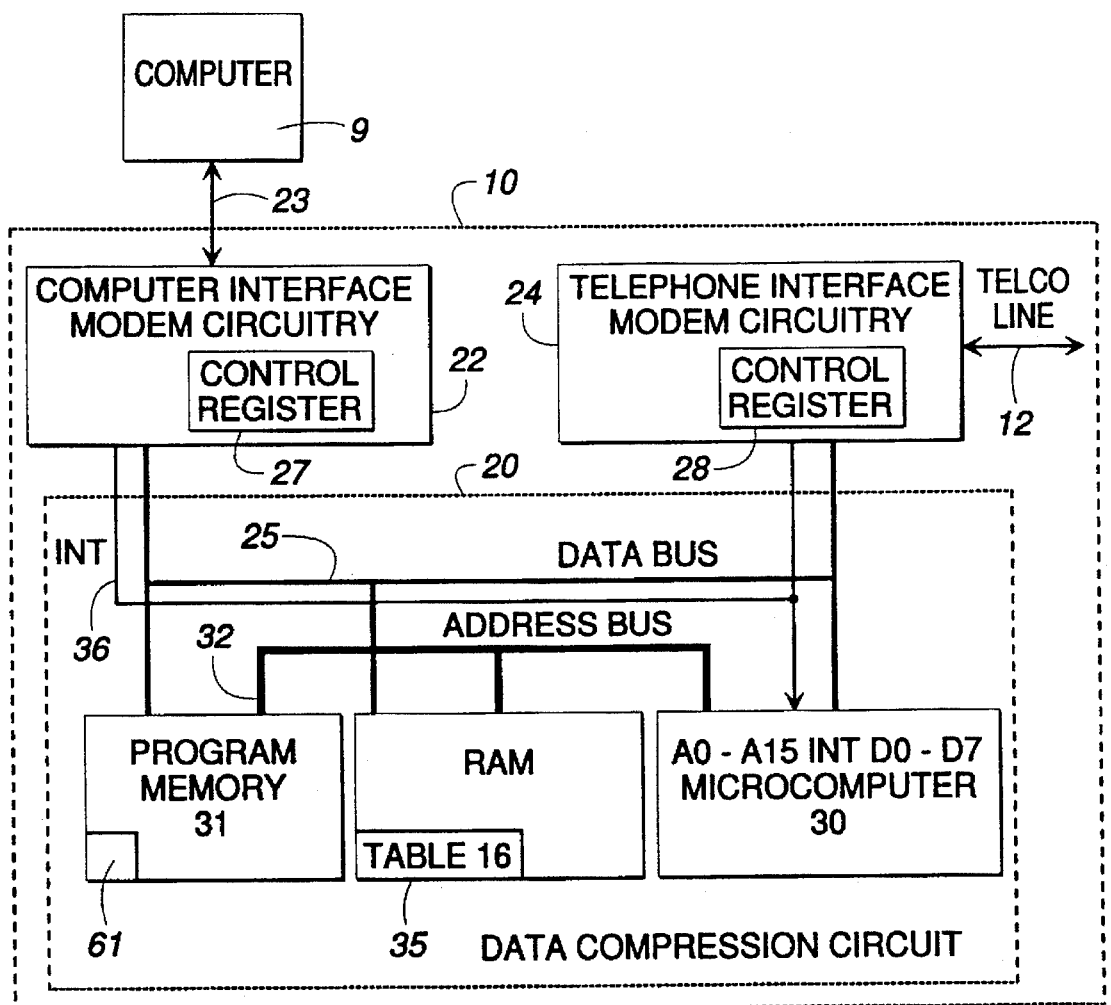
FIG. 3 is a block schematic diagram of a microprocessor based circuit for implementing the preferred method of data compression in a modem.

The encoding table 16 and decoding table 18 in the preferred embodiment are both implemented as a data array contained in a memory associated with a microcomputer or microprocessor 30, such as is illustrated in FIG. 3. FIG. 3 is a block schematic diagram of a microprocessor 30 based circuit for implementing the preferred method of data compression in a modem 10. Typically, modem 10 incorporates means for implementing the data compression method disclosed herein, and will include a data compression circuit 20. The data compression circuit 20 is connected to a modem computer interface circuit 22. The modem computer interface circuitry 22 is a conventional modem circuit and comprises circuitry for receiving a character of data over line 23 from an input source, such as a computer 9, and preparing that item of data for transmission. Typically, the characters of data are received as eight bit bytes, but larger bytes of data may be utilized. This eight bit byte is provided on a data bus 25 which is connected to the data compression circuit 20.

The results of data compression are provided on the data bus 25 to modem telephone interface circuit 24, which receives data from the compression circuit 20 and conditions the data for serial transmission over a communications link such as the telephone company line. In the preferred embodiment, data provided from the compression circuit 20 to the modem telephone interface circuit 24 is encoded in the manner described herein below to represent the character which was provided to the compression circuit by the modem computer interface circuit 22.

Continuing with FIG. 3, the preferred embodiment of the data compression circuit 20 comprises a microprocessor 30 which is responsive for receiving a byte of data from the modem computer interface circuit 22, compressing it, and then providing the encoded result back over the data bus 25 directed toward the modem telephone interface circuit 24 for serial transmission. The microprocessor 30 may be any one of a number of microcomputers or microprocessors, such as the Zilog Corporation Z80 microcomputer or the Intel Corporation 80486 microprocessor. The programming and operation of these microprocessors is well known to those skilled in the art and described in literature sold with the devices.

A memory device 31 connected to the microprocessor 30 contains the program for operation of the microprocessor 30. The memory device 31 is programmable read-only memory ("PROM") in the preferred embodiment of the present invention, but may be other types of memory familiar to those skilled in the art, such as read only memory, random access memory or electrically erasable read only memory. The memory device 31 is connected to the data bus 25 so that program instructions can be transmitted to the microprocessor 30 under program control. The address bus 32 of the microprocessor 30, consisting of lines A0–A15, is connected between the memory device 31 and the microprocessor 30 so that address signals from the microprocessor 30 can address the program memory in the known manner. Those skilled in the art will recognize that other configurations may be used for the data compression circuit 20. For example, the data bus 25 could be sixteen bits, the address bus 32 could be thirty-two bits, or the microprocessor 30 may be replaced with a hardware logic state machine.

The encoding table 16 (or decoding table 18, in the case where decompression is to be performed) is contained in a random access memory ("RAM") 35, which is connected to receive address signals on the address bus 32 and to receive and transmit data signals over data bus 25. In the preferred embodiment of the present invention, the RAM 35 can store up to 16384 entries for the encoding table 16, as well as tables and registers discussed below. Each entry requires seven bytes of storage so 16384 entries will require at least 114,682 bytes of memory. A RAM 35 of at least 128K bytes, or other sufficient size chosen by the system designer, is preferably used.

Control signals associated with the microprocessor 30 are not illustrated in FIG. 3, inasmuch as such elements will be known to those skilled in the art. Those skilled in the art will recognize that an interrupt (INT) signal on line 36 signals that data characters are to be provided by the computer interface circuit 22 to the data compression circuit 20. In a similar manner, the telephone interface circuit 24 provides the INT signal when the system is employed in a decoding mode. The interrupt signals inform the microprocessor 30 of the presence of data for data encoding or decoding, as the case may be, on the data bus 25. Alternatively, and for higher speed communications, direct memory access is used for accepting characters from the computer interface circuit 22.

Also included in the modem interface circuits 22 and 24 are control registers 27 and 28, respectively, which are employed to assist in the interface between the modem interface circuits and the data compression circuit 20. The control registers 27 and 28 provide various control signals needed to interface with the microprocessor 30. For example, when the microprocessor 30 is conditioned to be in an encoding state, the microprocessor 30 must acknowledge the receipt of each character from the circuit 22 for encoding. Accordingly, the microprocessor 30 responds in a handshaking manner to an interrupt from the modem computer interface circuit 22 by setting a bit in the control register 27 to acknowledge the interrupt and signal that the microprocessor 30 is busy. When the microprocessor 30 is able to accept another character for encoding, this busy signal is cleared, and the modem computer interface circuit 23 is then conditioned to provide another character for compression and ultimate transmission.

In a similar fashion, control register 28 facilitates the interface between the microprocessor 30 and the telephone interface circuit 24. When a coded compressed representation of a character is ready for transmission, the microprocessor 30 sets a bit in the control register 28 of the modem telephone interface circuit 24 to signal this circuit that a code is ready for transmission, and has been placed on the data bus for strobing into an appropriate storage register (not shown) in the circuit 24.

When the system is configured in a decoding mode, the data paths are reversed from that just described. Data is received from the telephone line 12 (FIG. 2), provided through the modem telephone interface circuit 24 to the microprocessor 30 for decompression, and then to the modem computer interface circuit 22 for provision over line 23 to the computer. An interrupt signal on line 36 signals that a character is ready to be passed from the telephone interface circuitry 24 to the decompression circuit 20. The interrupts from the modem circuits 22, 24 are wire-OR-ed so that either may generate an interrupt.

Figure 4:
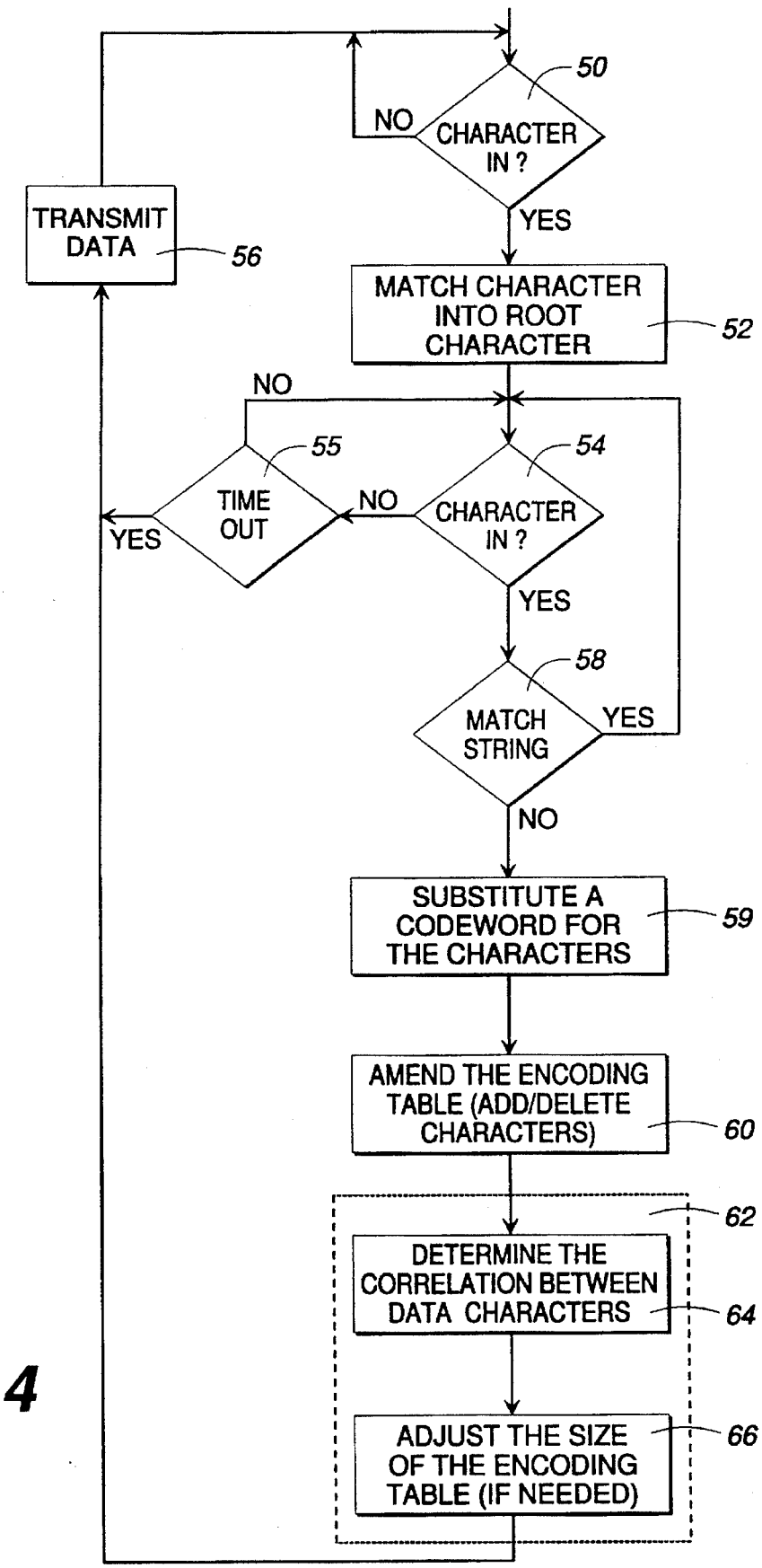
FIG. 4 is a flow chart of the steps taken to encode data using an encoding table and to determine the correlation between characters in the data stream and adjust the encoding table in response thereto.

Before discussing the preferred embodiment, it will be beneficial to review the data compression technique commonly referred to as "V.42bis." The preferred embodiment is utilized in conjunction with the V.42bis data compression system. An encoding table 16 is initially set-up in RAM 35 having a plurality of root characters 4 and preferably being from 512 to 16,384 entries in allocated size, each entry typically being about 7 bytes in size. The encoding table 16 could include 65,536 entries, according to the V.42bis standard, or as many entries as the RAM 35 is large enough to hold, as will be familiar to those skilled in the art. Referring to FIGS. 1 and 4, the contents of the encoding table 16 are strings 5 of characters grown from root characters 4. A root character 4, such as the character "B", has characters depending therefrom to form a tree 6. The characters in the encoding table 16 from which no other character depends, and which are not root characters 4, are leaf characters 7. The manner for storing the characters in encoding table 16 (and corresponding decoding table 18) is defined by the V.42bis standard promulgated by the CCITT.

In the preferred embodiment of the present invention, the encoding table 16 initially contains strings 5 of length one (the root character 4), and the encoding table 16 is filled as data is received in the modem 10 based on the CCITT V.42bis standard. The preferred environment of the present invention includes an encoding table 16 including a plurality of strings of characters, each of the strings depending from one of many root characters. The encoding table 16 includes codewords correlated to the strings that may be substituted for portions of the stream of characters. As in the V.42bis system, the microprocessor 30 in the modem 10 compares the characters in the input stream of data characters with strings of characters in the encoding table 16, and if the characters in the stream of data characters match one of the strings 5 in the encoding table 16, the microprocessor 30 replaces the characters in the stream of data characters with a corresponding one of the codewords. However, the encoding table 16 could be pre-loaded with commonly utilized words or symbols.

The preferred embodiment of the present invention is not dependent upon how codewords associated with strings are substituted for characters in the stream of data. In other words, the data compression scheme could be V.42bis, MNP-7 or other string based compression scheme. The preferred embodiment focuses on the past success achieved in compressing data to adjust the size of the encoding table 16 for more efficient data compression in any of these string-based compression schemes. To facilitate a better understanding of the preferred embodiment of the present invention however, the method of compressing data strings in the stream of data input to modem 10 is briefly described.

Data is preferably compressed in conjunction with use of the preferred embodiment according to the V.42bis standard, as follows. Referring to FIGS. 1 and 3, consider that the character string received in modem 10 from computer 9 is "BAY". The encoding table 16 is searched for the string "B". As this character is found as a root node 4, the next character is read and appended to form "BA". The encoding table 16 is searched for the new string, and after it is found the next character "Y" is read and appended to the string to form the string "BAY". The encoding table 16 is searched for "BAY", which is not present. "Y" is removed, and the string matching procedure exits with "BA" as the matched string and "Y" as the unmatched character. The codeword for "BA" is encoded and transmitted. The new string "BAY" is created by appending "Y" to "BA" in encoding table 16 and a codeword is assigned to "BAY". The character "Y" is used to start the next string match operation. Those skilled in the art will recognize that the encoding table 16 and decoding table 18 are grown to be identical so that data is not misinterpreted.

Generally speaking, the preferred data compression method comprises a sequence of steps that are implemented as a program for the microprocessor 30. FIG. 4 is a flow chart of the steps taken in determining the characteristics of the incoming data and adjusting the encoding table 16 (and decoding table 18) in response thereto to optimize data compression versus required processing time.

Referring to FIGS. 3 and 4, the first character entering the data compression circuit 20 is detected at step 50 and matched with a mot character 4 at step 52. After the first character is matched with a root character 4 at step 52, the data compression circuit 20 (FIG. 3) awaits the second data character at step 54. If no data character has been input to the data compression circuit 20 at step 54, the microprocessor 30 follows the "no" branch to step 55 to determine if a time-out has occurred. The time-out is a software timer (not shown), comprising executable code in memory 31 run by microprocessor 30 (FIG. 3). Those skilled in the art will recognize that a hardware timer, a counter or the like could be used in place of the software timer.

The time-out at step 55 indicates that the data compression circuit 20 will not wait any longer to receive more data characters. Thus, if a time-out occurs at step 55, the "yes" branch is followed to step 56. In the preferred embodiment, at step 56 data is compressed and transmitted over telephone line 12. Following the transmission of data at step 56, the data compression circuit 20 again waits for characters at step 50. Those skilled in the art will recognize that in another system, for example, mass data storage, the data would just be compressed and stored following the time-out at step 55.

On the other hand, the time-out may not occur at step 55. Thus, following the "no" branch from step 55, the data compression circuit 20 (FIG. 3) determines if a data character has been received at step 54. The second data character received, following the character detected at step 50, is detected at step 54. Following the "yes" branch, in response to receiving a character at step 54, step 58 is executed.

If possible, the second data character arriving at modem 10 is matched with a character in a string 5 (FIG. 1) in the encoding table 16 at step 58. Subsequent incoming data characters are also detected at step 54 and matched to a string at step 58. Thus, at steps 54 and 58 the incoming character(s) are detected and matched with a string 5 in the encoding table 16.

After an incoming character in the stream of data can not be matched with a string 5 in the encoding table 16 at step 58, the substitute codeword for the matched string is found at step 59. The unmatched character is stored and will be matched to a root character 4 at step 52 and used to begin matching incoming characters with a string in the encoding table 16, as was set forth above. The codeword that corresponds to the matched string is ultimately transmitted to the receiving modem 15 (FIG. 2) at step 56. The unmatched character will be transmitted without compression at step 56 to inform the decoding table 18 (FIG. 2) of the next root character 4, and the unmatched character is matched with a root character 4 and used as the seed character at step 52 in FIG. 4. Those skilled in the art are familiar with the substitution of codewords for strings of characters and the building and maintenance of marking encoding and decoding tables, such as is set forth in the V.42bis standard promulgated by the CCITT.

Regardless of whether the incoming stream of data characters generated by the computer 9 (FIG. 3) and entering the data compression circuit 20 is compressed at step 59, at step 60 the encoding table 16 is "pruned." For example, referring to FIGS. 1; 2 and 4 the word in the data stream arriving at the encoding table 16 may be "BATS." Only the word "BAT" is in a string in the encoding table entries shown in FIG. 1. The unmatched character "S" is added to depend from the character "T" to form the word "BATS" in the encoding table 16, and a codeword is associated in RAM 35 with "BATS" in a manner familiar to those skilled in the art, such as by mapping or directly linking the memory locations for the string and the codeword. However, the encoding table 16 has a fixed size. Thus, adding the character "S" to the encoding table 16 requires deleting another character.

An entry deletion routine 61 (FIG. 3) stored in program memory 31 is executed by the microprocessor 30 at step 60. The entry deletion routine 61 serves to prune a leaf character 7 from a tree 6 (FIG. 1) when a match is not found in the encoding table 16 for an incoming character. Therefore, the entry deletion routine 61 is typically called after a character is received in data compression circuit 20 and that character cannot be matched to a character in the encoding table 16 at step 58. Those skilled in the art are familiar with how the entry deletion routine 61 locates and removes a leaf character 7 in a tree 6 from the encoding table 16. The preferred embodiment of the present invention incorporates the pruning technique set forth in the V.42bis recommendation at step 60.

Figure 5:
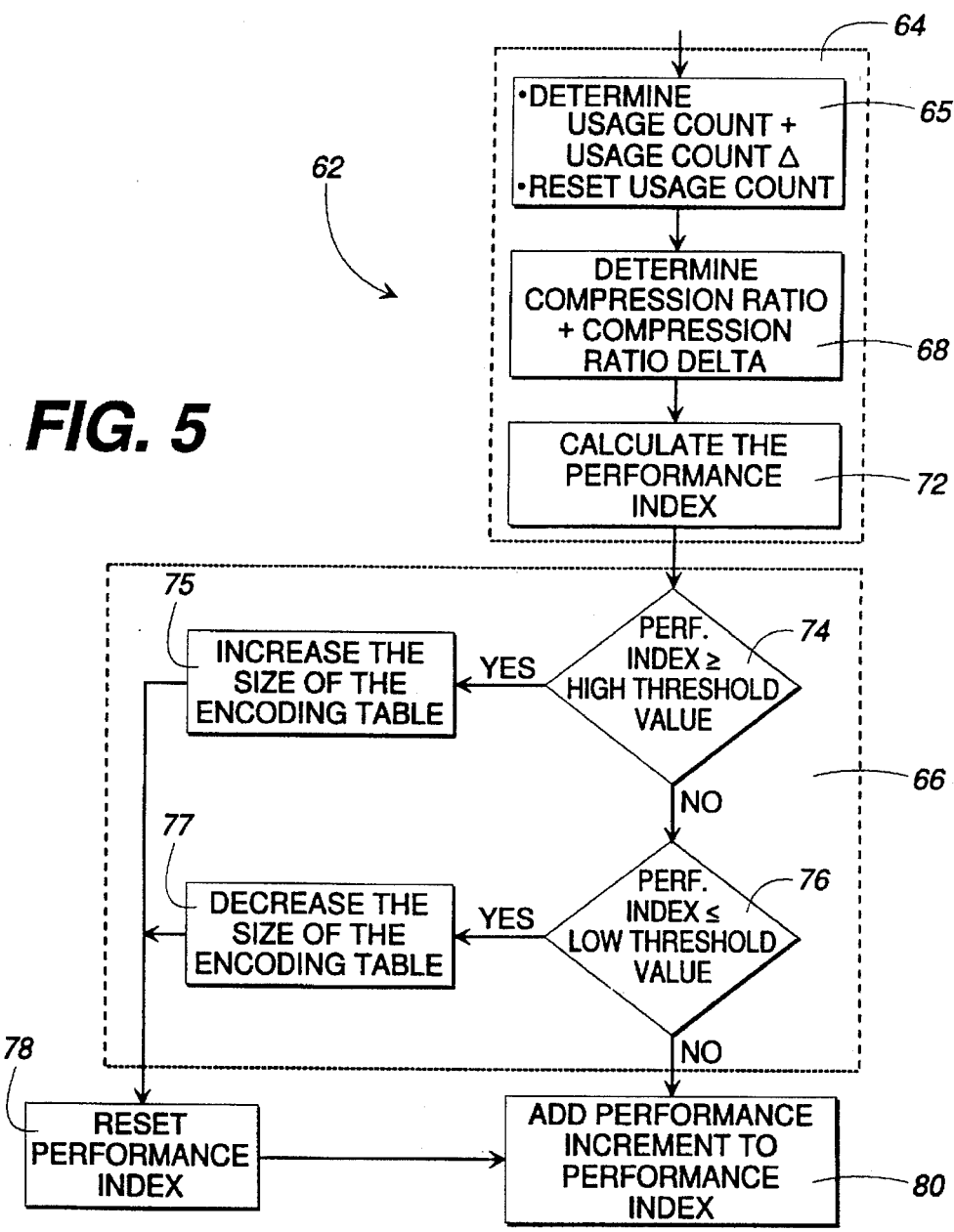
FIG. 5 is a detailed flow chart of the steps taken to determine the correlation between characters in the data stream and adjust the size of the encoding table.

Referring to FIGS. 4, 5 and 6, after the encoding table 16 is modified at step 60, the encoding table control program 62 is executed. In program 62, the correlation between data characters is analyzed and the size of the encoding table 16 may be changed (FIG. 5).

Referring to FIG. 4, program 62 is shown by the dotted line as including steps 64 and 66. The correlation between characters in the stream of data arriving at data compression circuit 20 from computer 9 (FIG. 3) is determined at step 64. In the preferred embodiment, the correlation between characters in the stream of data is determined by analyzing (1) the compression ratio of previously received data, and (2) characteristics of the encoding table 16. After determining the correlation between data characters at step 64, the size of the encoding table 16 is adjusted at step 66.

FIG. 5 is a detailed flow chart of the preferred encoding table control program 62 and the steps taken to determine the correlation between characters in the data stream and to adjust the size of the encoding table 16 to optimize data compression and minimize processor time consumed attempting to compress data. Proceeding to discuss the flow chart of FIG. 5, a broad description is first given of the preferred technique used to determine the correlation between characters in the stream of data arriving at the data compression circuit 20. At step 65, a characteristic of the encoding table 16 is analyzed to determine whether the encoding table 16 has narrow or wide trees 6. This characteristic is called a "normalized usage count", as discussed in detail below. Next, the compression ratio of the stream of data is determined at step 68. These two measures determined at steps 65 and 68 are taken together to calculate a performance index at step 72. The performance index is used to control adjustments to the size of the encoding table 16 at step 66.

Figure 6A:
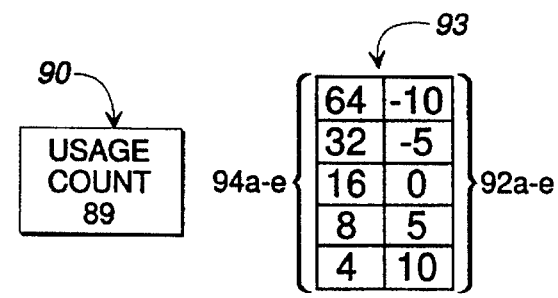
FIGS. 6a–c are block diagrams of the registers and table used by the microprocessor based circuit of FIG. 3 to calculate the correlation between characters in the data stream.
Figure 6B:
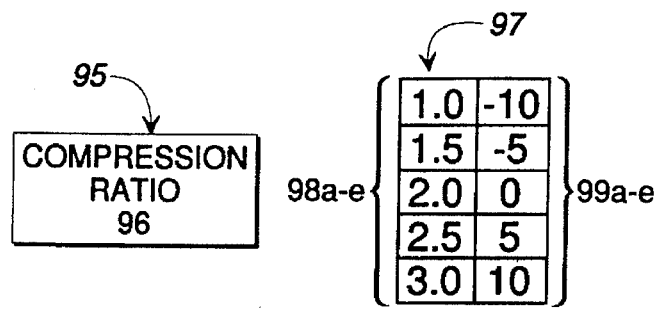
Figure 6C:
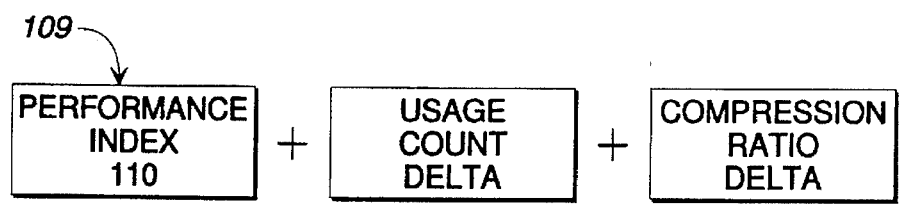

Before proceeding with the detailed description of program 62 in FIG. 5, refer briefly to FIGS. 6a–c. FIGS. 6a–c are block diagrams of the registers and tables used by the microprocessor based circuit (FIG. 3) to calculate the correlation between data characters in the stream of data arriving at modem 10 from computer 9 in the preferred embodiment of the present invention. Specifically, a register 89 holds the normalized usage count 90, a register 95 holds the compression ratio 96, and a register 109 holds the performance index 100. Furthermore, a table 93 stores usage count deltas 92 and a second table 97 stores compression ratio deltas 98, which are described in detail below. The registers 89, 95 and 99 and tables 93 and 97 are memory locations in RAM 35 (FIG. 3) in the preferred embodiment. However, the tables and registers can be fixed or variable memory locations in any device or means for storing data, as will be apparent to those skilled in the art.

In the preferred embodiment of the present invention, the nature of the data is first analyzed at step 65 (FIG. 5) based upon the shape of the trees in the encoding table 16. Referring to FIGS. 5 and 6a–c, the shape of the trees in the encoding table 16 is estimated using the normalized usage count 90 in register 89. The normalized usage count 90 is an average of the usage count. The usage count is preferably calculated each time the entry deletion routine 61 (FIG. 3) in program memory 31 is run. Thus, in the preferred embodiment, the usage count is calculated every time a string of data characters is matched with a codeword. The normalized usage count 90 is preferably calculated after every five-hundredth character is received in the modem 10 from computer 9. The usage count and normalized usage count 90 are reset to zero after the five hundredth character is received to begin calculating the next normalized usage count 90.

As is familiar to those skilled in the art, the entry deletion routine 61 (FIG. 3) in program memory 31 uses a pseudo-random method to find and delete a leaf character 7 in tree 6. Specifically, for the entry deletion routine a counter incrementally counts through the encoding table entries. When the entry deletion routine 61 is initiated, the counter goes to the next entry and determines if the entry has a null pointer (is a leaf character 7—FIG. 1). If the entry has a null pointer, it is a leaf character and it is deleted. If the entry does not have a null pointer, it is not a leaf character, the counter is incremented and the next entry is examined to find a leaf character for deletion. Those skilled in the art are familiar with programs such as the entry deletion routine 61. The usage count is simply the total number of entries searched to find a leaf entry to be deleted.

The normalized usage count 90 is calculated as follows:

Normalized Usage Count=(usage count)/(number of invocations of the entry deletion program)

The normalized usage count 90 is loaded in register 89 at step 65 and used as the estimate of tree width in the encoding table 16. The average width of the trees in the encoding table 16 may be calculated based on the normalized usage count 90, and is based on the following formula:

Average Width=1+2* Normalized Usage Count

The usage count is the total number of characters or entries examined. The normalized usage count 90 is an average of the usage count. The normalized usage count 90 is used herein as representative of the average width of the trees in encoding table 16. Those skilled in the art will recognize that the calculated Average Width could be used to estimate the correlation between data characters, and that other measures estimating the characteristics of trees in the encoding table 16 could be calculated. Those skilled in the art will recognize the plurality of different methods for calculating the usage count, normalized usage count, Average Width or other value representative of the shape of the trees in encoding table 16.

Continuing with step 65 in FIG. 5, the width of the trees in encoding table 16, estimated via the normalized usage count 90, is compared to the table 93 (FIG. 6a). In the table 93 are related usage count values 94a–e and usage count deltas 92a–e. The normalized usage count 90 is compared to predetermined threshold values of the usage count 94a–e. The usage count values 94a–e translate the normalized usage count 90 into a relative value usage count delta 92a–e. The normalized usage count values 94a–e preferably are 64, 32, 16, 8, and 4, respectively, although these values can be changed to adjust the sensitivity of the data compression circuit 20. Each predetermined usage count value 94a–e is associated with a usage count delta 92a–e. The normalized usage count 90 is matched with a usage count value 94a–e and an associated usage count delta 92a–e. For example, if the normalized usage count 90 is calculated as the value forty (40), the usage count value 94a–e closest thereto is usage count value 94b, which is equal to thirty-two. The usage count delta 92b of "–5" is assigned to usage count value 94b, and the value "–5" is added to the performance index 110, as is set forth below.

Referring to FIGS. 5 and 6b, the nature of the data is next analyzed at step 68 using the data compression ratio 96 stored in register 95. The compression ratio 96 is the number of bits input to the modem 10 from the computer 9 divided by the number of bits output from the modem 10 to the modem 15 (FIG. 2). In "intelligent" modems on the market today, such as modem 10, the compression ratio is calculated after five-hundred (500) characters enter the modem 10 from computer 9. Preferably, the calculated compression ratio 96 is loaded into register 95 from a memory location in modem 10 that is loaded with the calculated compression ratio each time that value is calculated. Alternatively, the program 62 in program memory 31 could calculate the compression ratio being achieved by the modem 10 once after every predetermined number of characters. Those skilled in the art will recognize that the frequency of times that the compression ratio 96 is calculated is adjustable as desired.

The compression ratio 96 in register 95 is compared to a table 97 of compression ratio values 98a–e to calculate a compression ratio delta 99a–e (FIG. 6b). If the compression ratio 96 were 1.1, for example, the compression ratio is compared to the predetermined compression ratio values 98a–e and is closest to "1.0". Therefore, in the example, the compression ratio delta 99a, equal to "–10", is associated with the compression ratio of "1.1". After the compression ratio register 96 is matched with a compression ratio delta 99a–e, the delta is added to the performance index 110.

Referring to FIGS. 5 and 6c, the usage count delta 92a–e determined at step 65 and the compression ratio delta 99a–e determined at step 66 are used to calculate the performance index 110 at step 72. In the present example, the usage count delta 92e and the compression ratio delta 99a are added to the performance index 110. Thereafter, at steps 74 and 76, the performance index 110 is compared to first and second predetermined threshold values 120 and 122, respectively. In the preferred embodiment, the high threshold value 120 is equal to one-hundred (100) and the low threshold value 122 is equal to zero (0). The threshold values 120, 122 are stored in memory 31 (FIG. 3). It will be apparent to those skilled in the art that the value of the low and high thresholds may be adjusted to control the sensitivity of the system, thereby increasing or decreasing the frequency at which the size of the encoding table 16 is changed. Furthermore, the order of execution of steps 74 and 76 is not fixed.

If the performance index 110 is determined to be greater than the high threshold value 120 at step 74, the "Yes" branch is followed to step 75 where the size of the encoding table 16 is increased. On the other hand, at step 76, if the performance index 110 is less than the low threshold value 122, the size of the encoding table 16 is decreased at step 77.

If the performance index 110 is a value between the threshold values 120 and 122, following the "No" branch at steps 74 and 76 indicates that the encoding table 16 is the correct size to encode the incoming data. Thus, the size of the encoding table 16 is adjusted only if the size of the encoding table 16 is not appropriate compared to the correlation between the stream of data characters arriving at modem 10.

Summarizing step 66, if the performance index 110 is greater than the high threshold value 120 at step 74, the normalized usage count at 90 and compression ratio 96 values have combined to adjust the performance index 110 to indicate that the incoming data is highly correlated. Thus, the memory space allocated to the encoding table 16 is increased at step 75. On the other hand, if the performance index 110 is less than the low threshold value 122 at step 76, the normalized usage count 90 and compression ratio 96 have effected the performance index 110 to indicate that the incoming data is, at most, weakly correlated. Therefore, the memory space allocated to the encoding table 16 is decreased at step 77.

Those skilled in the art will recognize that the performance index 110, usage count deltas 92a–e, compression ratio deltas 99a–e, and threshold values 120 and 122 are relative and may be changed as desired. The usage count values 94a–e and compression ratio values 98a–e set forth herein are exemplary and other values may be chosen by the user, and more or fewer of these values may be set according to the designers specifications. Furthermore the size of the encoding table 16 could be increased or decreased by different levels within the present invention. It will be apparent that the size of the encoding table 16 could be increased if the performance index 100 is greater than (or equal to) a predetermined threshold and increased if the performance index 110 is less than (or equal to) a predetermined threshold, provided that the values of the usage count deltas 92a-e, compression ratio deltas 99a-e, and performance increment (discussed later) are appropriately changed.

The size of the encoding table 16 is increased and decreased in RAM 35 as follows. If the memory space allocated to the encoding table 16 is to be increased at step 77, the parameters limiting the size of the encoding table 16, such as the length of strings in the encoding table, the maximum codeword size, and the total number of codewords, are increased. Increasing the parameters enables the strings within the encoding table 16, and the encoding table itself, to grow to a larger size. The new memory space allocated to encoding table 16 will be loaded with strings as data characters are received in the modem 10.

If the memory space allocated to the encoding table 16 is decreased at step 75, however, existing entries have to be deleted from the encoding table 16. In the preferred embodiment, the encoding table 16 is completely reinitialized when the size of the encoding table 16 is decreased. Specifically, all characters except the root characters 4 are deleted and the parameters limiting the size of the encoding table 16, the length of strings in the encoding table, the maximum codeword size, and the total number of codewords are decreased. Strings 5 are then grown from the root characters 4 in the encoding table 16 as if no data had been received in the modem 10. As will be apparent to those skilled in the art, reinitializing the encoding table 16 causes some delay while strings 5 are built to fill up the RAM 35 allocated to the now smaller encoding table 16. However, when the size of the encoding table 16 is decreased, the characters in the stream of data are less correlated and the encoding table 16 was not performing well at compressing the data before it was reinitialized. Therefore, reinitializing the encoding table 16 is advantageous. Those skilled in the art will recognize that the size of the table 16 could be decreased by selectively deleting characters from the table 16. However, this increases the microprocessor 30 time that must be devoted to adjusting the size of the table.

After the size of the encoding table 16 is decreased at step 75 or increased at step 77, the performance index 110 is set back to a median value at step 78. Preferably, the performance index 110 is set back to the value "50" (between the high threshold value 120 of "100" and the low threshold value 122 of "0"). Thus, the process of detecting the correlation between data characters, adjusting the performance index 110 in response thereto, and adjusting the size of the encoding table 116 is repeated. If desired, at this time the threshold values, or other values discussed above, may be altered to increase or decrease the sensitivity of the preferred embodiment to the correlation between data characters.

Figure 7:
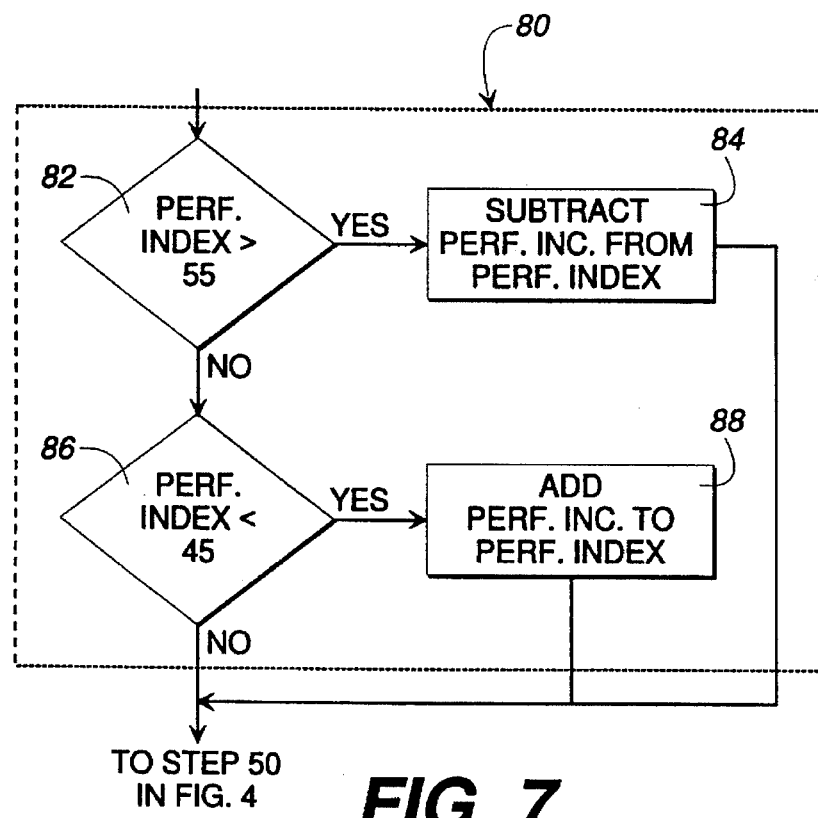
FIG. 7 is a flow chart of the steps taken to limit the frequency of changing the size of the encoding table.

Step 80 in FIG. 5 is entered regardless of whether the size of the encoding table 116 is changed. Step 80 calls for the addition or subtraction of a predetermined performance increment to the performance index 110. Specifically, in the preferred embodiment, the predetermined value is a performance increment having a value of "5." FIG. 7 is a flow chart of the steps taken to add a performance increment to the performance index. Referring briefly to FIG. 7, if the performance index 110 is greater than "55" at step 82, the performance increment of "5" is subtracted from the performance index 110 at step 84. If the performance index is less than "45" at step 86, the performance increment of "5" is added to the performance index 110 at step 88. After step 80, the program returns to step 50 in FIG. 4.

The effect of the steps in FIG. 7 is to slightly push the performance index 110 toward a median value. It is undesirable for small values of the usage count deltas 92a-e and compression ratio deltas 99a-e to slowly be added to the performance index 110 and ultimately cause a change in the size of the encoding table 116. The performance increment limits changes to the size of the encoding table 16 to occur only in response to substantial changes in the correlation between characters in the stream of data arriving in the data compression circuit 20 (FIG. 3). It will be apparent to those skilled in the art that the value of the performance index is selectable to increase or decrease system sensitivity.

In the preferred embodiment, the size of the encoding table 16 is incrementally adjusted in size. For example, in the preferred embodiment the encoding table 16 is initially 2048 entries in size. When the memory space allocated to the encoding table 16 is increased at step 75 (FIG. 5), the encoding table 16 is increased to 4096 entries. The next incremental step of the encoding table 16 is 8192 entries. This is the maximum size of the encoding table 16 in the preferred embodiment, although it will be apparent to those skilled in the art that the encoding table 16 can be smaller or larger and that the incremental steps may be further apart or closer together. Likewise, the preferred encoding table 16 is incrementally decreased in size in steps from 8192 entries, 4096 entries, 2048 entries, to 1024 entries.

As the size of the encoding table 16 is adjusted, the size of the codewords is likewise adjusted. For example, the codeword steps from 10, 11 to 12 bits as the encoding table 16 is incremented in size from 1024, 2048, to 4096 entries. This adjusts codeword size to correspond to the type of data being transmitted.

There are a plurality of methods for determining correlation between data characters based upon the characteristics of the encoding table 16. Specifically, for example, the total number of leaf characters 7 in the entire encoding table 16 may be counted to determine tree width. It will be apparent to those skilled in the art that the normalized usage count 90 may be calculated at a time other than during the entry deletion routine 61. For example, the normalized usage count 90 could be determined after each data character is received in the modem 10, or after any predetermined number of characters are received in the modem 10 (i.e.— every 100th character). Those skilled in the art will recognize that the characteristics of the encoding table 16 could be analyzed during the search loop portion of the program (steps 54 and 58 in FIG. 4) which attempts to match each character received in modem 10 with a character in the encoding table, or at other times as selected by the system designer. However, the processing burden of calculating the characteristics of the encoding table should be minimized.

In summary, the preferred embodiment of the data compression circuit 20 completes the following steps, shown in FIG. 5, to carry out the method of adjusting the size of the encoding table 16 to optimize data compression and minimize microprocessor 30 time consumed:

(a) determining a normalized usage count 90 and a usage count delta 92a-e at step 65;

(b) determining the compression ratio 96 of the data and a compression ratio delta 99a-e at step 68;

(c) adding the usage count delta 92a-e and a compression ratio delta 99a-e to the performance index 110 at step 72;

(d) comparing the performance index 110 with a first low and a second higher threshold at steps 74 and 76, respectively; and (i) if the performance index 110 is greater than the high threshold 120 at step 74, increase the memory space in RAM 35 allocated to the encoding table 16.

(ii) if the performance index 110 is less than the low threshold 122 at step 76, decrease the memory space in RAM 35 allocated to the encoding table 16.

(iii) if the width of the average tree in the encoding table is between the high threshold 120 and low threshold 122, do not adjust the size of the encoding table 16.

(e) add a damping factor to the performance increment at step 80.

The steps taken in FIGS. 4 and 5 to modify the encoding table 16 are duplicated in the decoding table 18 in modem 15 (FIG. 2). Those skilled in the art are familiar with methods of simultaneously maintaining identical encoding and decoding tables, 16 and 18, respectively. For example, in FIG. 5 when the size of the encoding table 16 is increased at step 77 or decreased at step 75, the size of the decoding table 18 is also adjusted accordingly by similar operations to FIGS. 4–7 performed in modem 15.

Those skilled in the art will recognize that the performance index is a relative value used to measure the random or non-random (correlated) nature of the data. Other scales or measures could be used to reflect and track the correlation between data characters. Further, either of the usage count or the compression ratio could be independently added to the performance index, and other measures could be used independently or together to calculate the performance index.

Also, the sizes to which the encoding table 16 may be adjusted are a matter of preference to the designer and user of the present invention. The present invention embodies any system wherein a characteristic of the encoding table is utilized to estimate the correlation between data being compressed and, based thereon, to adjust the size of the encoding table that is used to compress the data.

It will be apparent to those skilled in the art that the above described preferred embodiment could be modified for use outside the data communications environment. The technique of adjusting the size of the encoding table in real-time response to the correlative nature of the data could be used for data compression in many environments, such as within a computer storing data in a database. The scope of the present invention is intended to include such systems. Further, the present invention may be utilized in conjunction with encoding schemes other than V.42bis.

As will be apparent to those skilled in the art, the present invention is very appropriate for implementation using techniques such as Fuzzy Logic or Neural Networks. FIGS. 8a and 8b show the fuzzy sets associated with the usage count values 94a–e and the compression ratio values 98a–e, respectively. Within conventional logic or set theory items are regarded as belonging to one set or another. Thus, FIGS. 8a and b roughly correlate usage count values 94a–e and compression ratio values 99a–e with sets from very high to very low.

However, within fuzzy set theory, values are regarded as having a degree of membership of a set, and may belong to more than one set. A membership function defines the relationship between values and sets. FIG. 8c shows an illustrative membership function for the calculated normalized usage count 90 and the sets "very high" 120a, "high" 120b, "medium" 120c, "low" 120d, and "very low" 120e. FIG. 8d shows an illustrative membership function for the compression ratio 95 (FIG. 6b) and the sets "very high" 122a, "high" 122b, "medium" 122c, "low" 122d and "very low" 122e. The membership for each set in FIGS. 8c and d are thus "very high", "high", "medium", "low" and "very low".

For example, referring to FIG. 8c, if the normalized usage count 90 is twenty-five (25), this corresponds to a membership degree of 0.4 to set medium 120c and 0.6 to set high 120b, the usage count delta 92 is computed as the weighted sum of the values associated with each set, as follows:

usage count delta=0.4*0+0.6*(−5)=−3

Likewise, referring to FIG. 8d, if the compression ratio 95 is one point eight (1.8), this corresponds to a membership degree of 0.2 to set low 122b and 0.8 to set medium 122c. The compression ratio delta 99 is computed as the weighted sum of the values associated with each set.

compression ratio delta=0.2*(−5)+0.8*0=−1

The performance index 110 would then be calculated using the computed delta values set forth above as follows:

performance index=prior performance index+usage count delta+ compression ratio delta Therefore, in the above example, a value of negative four (−4) is added to the performance index 110 based on adding the usage count delta of (−3) and the compression ratio delta of (−1).

Figure 9:
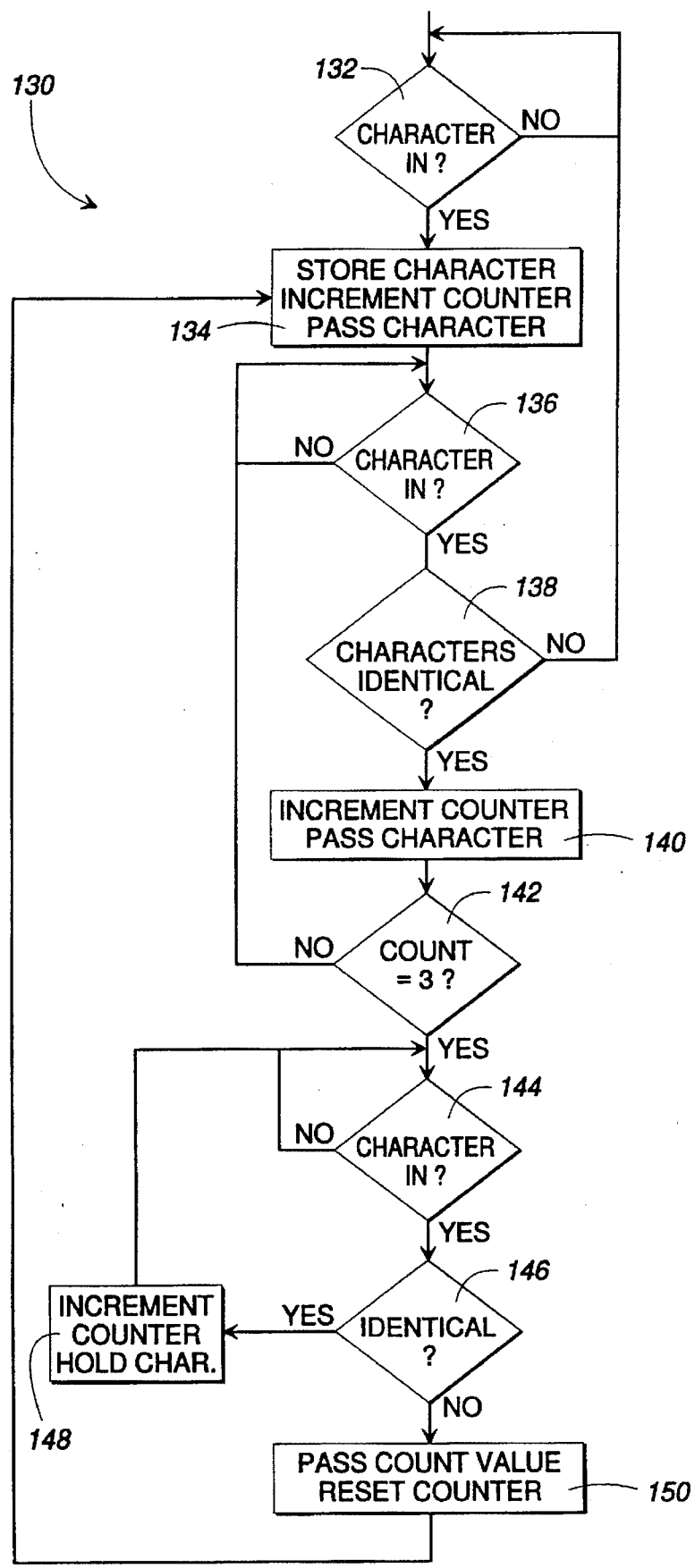
FIG. 9 is a flow chart of operation of a run length encoding program wherein the stream of data is preprocessed before passing to the encoding table.

Referring to FIG. 9 and back to FIG. 3, another feature provided by the present invention is set forth. Specifically, data is pre-processed by a run length encoding (RLE) program 130 before it is compressed by the data compression circuit 20 in modem 10. The RLE 130 is preferably stored in the program memory 31, although it may be put in other memory locations in the modem 10 or in computer 9.

In the preferred embodiment, before outbound data is passed to the data compression circuit 20, the data is analyzed by the RLE 130. The RLE 130 performs two general steps: (1) detecting a series of sequential identical characters, and (2) substituting a codeword for the series of identical characters. The RLE 130 removes runs of identical sequential characters from the data stream before the characters distort the encoding table 16 and decoding table 18 (FIG. 3).

Referring to FIG. 9, the detailed operation of the run length encoding program 130 is set forth. The preferred RLE 130 is software written to detect a first character on data bus 25 (FIG. 3) at step 132. At step 134, the first character is stored, a counter is incremented, and the first character is examined by the microprocessor 30 which begins executing the program set forth in FIG. 4 to encode the first character using the encoding table 16.

At step 136, a second character is detected. The first and second characters are compared at step 138. If the characters are not identical as determined at step 138, the run length encoding program 130 is begun again by following the No branch to step 132.

On the other hand, if the first and second characters are identical as determined at step 138, the Yes branch is followed to step 140. At step 140 a counter is incremented indicating that another identical character was detected. Further, the second character is examined by the microprocessor 30 which begins executing the program set forth in FIG. 4 to encode the second character using the encoding table 16, as set forth above.

At step 142, the counter total is analyzed. If the counter total is less than three at step 142, the No branch is followed to step 136 to await further characters. Thus, until the counter total is equal to three, meaning that three sequential identical characters have been detected, the data characters are simply noted and passed on for encoding as set forth in FIG. 4 using the encoding table 16.

If three identical characters are consecutively received, the counter 142 will equal three at step 142. In this case, the Yes branch is followed and step 144 is executed. At step 144, characters subsequent to the three identical characters are detected. After each subsequently received character is identified as identical to the three identical characters at step 146, the counter is incremented at step 148. Further, the character is held, meaning that the character is not encoded using the encoding table 16 and is therefore not transmitted out of the modem 10. After step 148, the modem 10 awaits another character at step 144.

Eventually a character will be detected at step 146 that is not identical to the first three identical characters. When a non-identical character is detected at step 146, the No branch is followed to step 150 where the count total is passed to the program in FIG. 4 for encoding using the encoding table 16 described above. Further, the counter is reset to zero. The RLE program 130 then proceeds to step 134, wherein the non-identical character is stored as the new character to be used to find identical characters. The counter is incremented to one at step 134, and the character detected at step 144 and determined not to be identical at step 146 is passed for encoding via the encoding table 16 (FIG. 2).

Each of a consecutive group of three identical characters are passed along to be encoded by the encoding table 16. After the first three identical characters, however, subsequent identical characters are not analyzed using the encoding table 16. The counter counts up with each identical character detected. Thus, the total number of sequential identical characters is counted. After a character is received that is not identical to the series of sequential identical characters, the total number of received identical characters is transmitted to the microprocessor 35 for encoding using the encoding table 16. Thus, a code is formed for long series of identical characters. Specifically, three identical characters are always followed by a number representing the total number of identical characters. Thus, the code is three identical characters followed by a number representing the number of times the identical character was repeated.

The decoder (not shown) following the decoding table 18 (FIG. 2) recognizes that any time it receives three identical characters, the next character received will be a number representing the total number of identical characters in the string. Other numbers of identical characters may be used to identify a code for a string of identical characters. For example, four identical characters could precede a count of the number of identical characters. The designer may establish a minimum number of sequential identical characters that must be detected before a code is substituted therefore. This eliminates substituting the code for only two identical sequential characters, which would likely result in data expansion. The modems 10, 15 establish whether run length encoding is a feature that will be used during initial handshaking in a manner familiar to those skilled in the art.

Those skilled in the art will recognize that many of the components of the invention described above in the preferred embodiment may be software or hardware. For example, the counters and adders may be implemented in software or hardware, as is familiar to those skilled in the art.

In view of the foregoing description of the preferred embodiment in its intended environment, other embodiments of the present invention will suggest themselves to those skilled in the art. Therefore, the scope of the present invention is to be limited only by the claims below and equivalents thereof.

I claim:

1. In a device for compressing a stream of data characters, the device including an encoding table that includes a plurality of strings of characters, the strings of characters in said encoding table being correlated to codewords that may be substituted for portions of the stream of data characters when a portion of the stream of characters matches one of the strings of characters in said encoding table, a method for controlling the encoding table to improve the efficiency and rate of data compression, comprising the steps of:

estimating the correlation between data characters in the stream of data characters;

adjusting a performance index in response to said estimated correlation between data characters; and changing the memory space allocated to said encoding table in response to said performance index.

2. In a device for compressing a stream of data characters, the device including an encoding table that includes a plurality of strings of characters, the strings of characters in said encoding table being correlated to codewords that may be substituted for portions of the stream of data characters when a portion of the stream of characters matches one of the strings of characters in said encoding table, a method for controlling the encoding table to improve the efficiency and rate of data compression, comprising the steps of:

estimating the correlation between data characters in the stream of data characters by
      determining a compression ratio for the stream of data characters input to the device, said compression ratio being equal to the number of characters input to the device divided by the number of data bytes output from the device, and
      determining a usage count, said usage count being used to estimate one of the average length and width characteristics of at least one of said trees in said encoding table;

adjusting a performance index in response to said estimated correlation between data characters; and changing the memory space allocated to said encoding table in response to said performance index.

3. The method of compressing data as recited in claim 2, wherein the step of adjusting said performance index in response to said determined correlation between data characters includes adjusting said performance index based upon the determined values of said compression ratio and said usage count.

4. The method of compressing data as recited in claim 3, wherein the step of adjusting said performance index includes the steps of:

increasing said performance index by a first predetermined amount when said compression ratio is below a first predetermined value and said usage count is greater than a second predetermined value; and decreasing said performance index by a second predetermined amount when said compression ratio is greater than a third predetermined value and said usage count is less than a fourth predetermined value.

5. The method of compressing data as recited in claim 4, wherein the step of changing the memory space allocated to said memory table includes:

decreasing the memory space allocated to said encoding table when said performance index exceeds a predetermined first value; and increasing the memory space allocated to said encoding table when said performance index is less than a predetermined second value.

6. The method of compressing data as recited in claim 2, wherein said usage count is calculated as a normalized value over a predetermined number of times when a delete entry routine is executed, said delete entry routine determining and deleting a leaf character from said encoding table.

7. The method of compressing data as recited in claim 6, wherein said usage count is calculated by averaging over time the number of characters in the trees.

8. The method of compressing data as recited in claim 2, wherein said usage count is determined by counting and averaging over time the number of characters in a string searched before a match is found between a character in the stream of data characters and a character in the encoding table, and multiplying the number of characters by two.

9. The method of compressing data as recited in claim 2, wherein the usage count is determined by counting the total number of leaf characters in the encoding table.

10. In a device for compressing a stream of data characters, the device including an encoding table that includes a plurality of strings of characters, the strings of characters in said encoding table being correlated to codewords that may be substituted for portions of the stream of data characters when a portion of the stream of characters matches one of the strings of characters in said encoding table, a method for controlling the encoding table to improve the efficiency and rate of data compression, comprising the steps of:

determining the correlation between data characters in the stream of data characters;

adjusting a performance index in response to said determined correlation between data characters;

decreasing the memory space allocated to said encoding table when said performance index exceeds a predetermined first value; and increasing the memory space allocated to said encoding table when said performance index is less than a predetermined second value.

11. In a device for compressing a stream of data characters, the device including an encoding table that includes a plurality of strings of characters, the strings of characters in said encoding table being correlated to codewords that may be substituted for portions of the stream of data characters when a portion of the stream of characters matches one of the strings of characters in said encoding table, a method for controlling the encoding table to improve the efficiency and rate of data compression, comprising the steps of:

determining the correlation between data characters in the stream of data characters;

generating a performance index that is adjusted in response to said determined correlation between data characters;

decreasing the memory space allocated to said encoding table when said performance index is less than a first predetermined value; and increasing the memory space allocated to said encoding table when said performance index is greater than a second predetermined value.

12. In a device for compressing a stream of data characters input to the device, the device including an encoding table that includes a plurality of strings of characters, the strings of characters in said encoding table being correlated to codewords that may be substituted for portions of the stream of data characters when a portion of the stream of characters matches one of the strings of characters in said encoding table, a method for controlling the encoding table to improve the efficiency and rate of data compression, comprising the steps of:

determining a compression ratio for the stream of data characters input to the device, said compression ratio being equal to the number of characters input to the device divided by the number of data bytes output from the device;

determining a usage count, said usage count representing one of the average length of said strings and the width of said trees in said encoding table;

calculating a performance index using said compression ratio and said usage count;

decreasing the memory space allocated to said encoding table when said performance index is less than a first predetermined value; and increasing the memory space allocated to said encoding table when said performance index is greater than a second predetermined value.

13. The method of compressing data as recited in claim 12, wherein said usage count is estimated by counting the number of strings that are directly dependent from each root in said encoding table.

14. The method of compressing data as recited in claim 12, wherein said usage count is estimated by counting the number of characters in a string searched before a match is found between a data character in the stream of data and a character in the encoding table, and multiplying said counted value by two.

15. The method of compressing data as recited in claim 12, wherein said usage count is determined during the process of deleting entries from the encoding table by counting the number of characters in a branch between a root node and an entry that is to be deleted, and multiplying said counted value by two.

16. The method of compressing data as recited in claim 12, wherein the usage count is calculated by counting a portion of the total number of leaf characters in said encoding table.

17. A method of compressing a stream of data characters, comprising the steps of:

comparing strings of characters in an encoding table with the stream of data characters to determine if one of said strings of characters matches a portion of said stream of data characters;

providing codewords that are correlated to said strings of characters, wherein one of said codewords may be substituted for a portion of said stream of characters when one of said strings of characters matches said portion of said stream of data characters;

determining the correlation between data characters in the stream of data characters; and adjusting the memory space allocated to said encoding table based upon said correlation between data characters in the stream of data characters.

18. A device for compressing a stream of data characters input to the device, the device including an encoding table that includes a plurality of strings of characters, the strings of characters in said encoding table being correlated to codewords that may be substituted for portions of the stream of data characters when a portion of the stream of characters matches one of the strings of characters in said encoding table, comprising:

means for determining the correlation between data characters in the stream of data; and means for adjusting the size of the encoding table in response to the determined correlation between data characters in the stream of data characters.

19. A device for compressing a stream of data characters input to the device, the device including an encoding table that includes a plurality of strings of characters, the strings of characters in said encoding table being correlated to codewords that may be substituted for portions of the stream of data characters when a portion of the stream of characters matches one of the strings of characters in said encoding table, comprising:

means for calculating the compression ratio of the stream of data input to the device;

means for calculating one of the width and length of a tree in the encoding table;

means for combining said compression ratio and said one of the width and length of a tree to produce a performance index that represents the correlation between data characters; and means for adjusting the size of the encoding table in response to the determined correlation between data characters in the stream of data characters.

20. A method of compressing a stream of data characters received in a computer device, comprising the steps of:

detecting a first character in the stream of data characters;

matching said detected character to a root character in an encoding table;

detecting characters in the stream of data characters subsequent to said first character;

matching said characters in the stream of data characters subsequent to said first character with a string depending from said root character;

substituting a codeword for said string that matches said characters in the stream of data characters;

determining the correlation between data characters in the stream of data characters;

generating a performance index that is adjusted in response to said determined correlation between data characters;

decreasing the memory space allocated to said encoding table when said performance index equals a predetermined first value; and increasing the memory space allocated to said encoding table when said performance index equals a predetermined second value.

\* \* \* \* \*